US010575408B2

(12) United States Patent
Armiento et al.

(10) Patent No.: US 10,575,408 B2
(45) Date of Patent: Feb. 25, 2020

(54) ELECTRICAL CONNECTORS, CIRCUIT BOARDS, AND FABRICATION TECHNIQUES

(71) Applicant: University of Massachusetts, Boston, MA (US)

(72) Inventors: Craig A. Armiento, Acton, MA (US); Alkim Akyurtlu, Arlington, MA (US)

(73) Assignee: University of Masschusetts, Boston, MA (US)

( * ) Notice: Subject to any disclaimer, the term of this patent is extended or adjusted under 35 U.S.C. 154(b) by 0 days.

(21) Appl. No.: 15/917,268

(22) Filed: Mar. 9, 2018

(65) Prior Publication Data

US 2018/0263119 A1    Sep. 13, 2018

Related U.S. Application Data

(60) Provisional application No. 62/469,607, filed on Mar. 10, 2017.

(51) Int. Cl.
*H05K 3/10* (2006.01)
*H01R 43/00* (2006.01)
(Continued)

(52) U.S. Cl.
CPC .............. *H05K 3/108* (2013.01); *B33Y 80/00* (2014.12); *H01R 4/48* (2013.01); *H01R 43/00* (2013.01);
(Continued)

(58) Field of Classification Search
CPC .... H05K 3/108; H05K 1/0284; H05K 3/4632; H05K 2201/0129; H05K 2201/09754;
(Continued)

(56) References Cited

U.S. PATENT DOCUMENTS 3,614,714 A * 10/1971 Silverstein ......... H01R 12/7005
439/633
4,513,064 A * 4/1985 Marcus .................. H05K 3/366
361/803

(Continued)

OTHER PUBLICATIONS

Weber, Austin, "Assembly, Does 3D Printing Work with Wiring?" Oct. 1, 2013, pp. 3, www.assemblymag.com/articles/91584.

*Primary Examiner* — Travis S Chambers
(74) *Attorney, Agent, or Firm* — Armis IP Law, LLC

(57) ABSTRACT

A printed electrical connector design includes two flat patterned thermoplastic plates printed with mechanical registration features that align conductive traces on the two plates of the electrical connector. A top plate is printed with a plurality of raised pedestals and a plurality of metallic traces. A bottom plate is printed with a plurality of recessed channels and a corresponding plurality of metallic traces. The plurality of recessed channels of the bottom plate are configured to mate with the plurality of raised pedestals on the top plate. The pedestals and channels of the top and bottom plates, respectively, serve to align the metallic traces that comprise the electrical connector. The printed electrical connector design allows printed electrical/electronic circuits and/or devices to be manufactured and interfaced with other printed electrical/electronic circuits and/or devices.

24 Claims, 7 Drawing Sheets

(51) Int. Cl.
   *H05K 3/46*   (2006.01)
   *H01R 4/48*   (2006.01)
   *H05K 1/02*   (2006.01)
   *B33Y 80/00*  (2015.01)

(52) U.S. Cl.
   CPC ......... *H05K 1/0284* (2013.01); *H05K 3/4632* (2013.01); *H05K 2201/0129* (2013.01); *H05K 2201/09754* (2013.01); *H05K 2201/10106* (2013.01); *H05K 2203/167* (2013.01)

(58) Field of Classification Search
   CPC ... H05K 2201/10106; H05K 2203/167; H05K 1/14; H01R 4/48; H01R 43/00; H01R 12/52; H01R 12/62; H01R 12/716; H01R 9/096; H01R 23/70; H01R 23/7068; H01R 12/72; H01R 13/64
   USPC ..... 439/67, 60, 62, 65, 69, 74, 951, 374, 55
   See application file for complete search history.

(56) References Cited

U.S. PATENT DOCUMENTS

| | | | | |
|---|---|---|---|---|
| 4,764,129 A * | 8/1988 | Jones | ........... | H01R 13/642 439/677 |
| 5,072,520 A | 12/1991 | Nelson | | |
| 5,219,292 A * | 6/1993 | Dickirson | ........... | H01R 9/096 439/65 |
| 5,920,465 A * | 7/1999 | Tanaka | ........... | H01R 12/62 361/749 |
| 5,938,455 A * | 8/1999 | Glovatsky | ........... | H01R 12/58 439/290 |
| 5,980,296 A * | 11/1999 | Mori | ........... | H01R 23/661 439/329 |
| 6,285,432 B1 * | 9/2001 | Phillips | ........... | G02F 1/13452 349/149 |
| 6,746,286 B2 * | 6/2004 | Blaha | ........... | H01R 4/4809 439/436 |
| 6,942,492 B2 * | 9/2005 | Alvarez | ........... | A63H 19/18 439/289 |
| 7,478,472 B2 * | 1/2009 | Lauffer | ........... | H01L 23/552 174/36 |
| 8,314,338 B2 * | 11/2012 | Ishii | ........... | H05K 1/142 174/255 |
| 2005/0085129 A1 * | 4/2005 | Chiou | ........... | G06K 19/07732 439/607.01 |
| 2008/0045076 A1 * | 2/2008 | Dittmann | ........... | H01R 23/661 439/495 |
| 2013/0344712 A1 * | 12/2013 | Kole | ........... | H05K 3/363 439/67 |
| 2016/0268706 A1 | 9/2016 | O'Rourke et al. | | |
| 2017/0087639 A1 * | 3/2017 | Folgar | ........... | B22F 3/1055 |

* cited by examiner

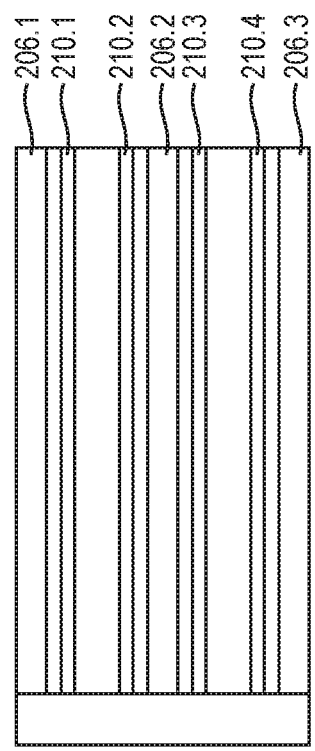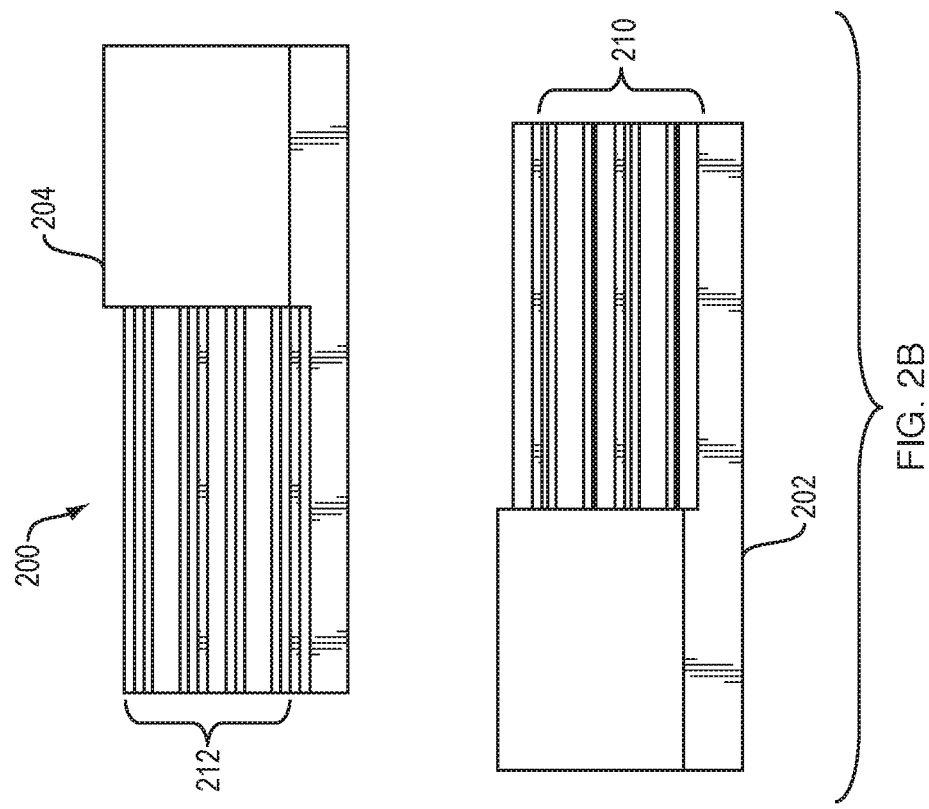

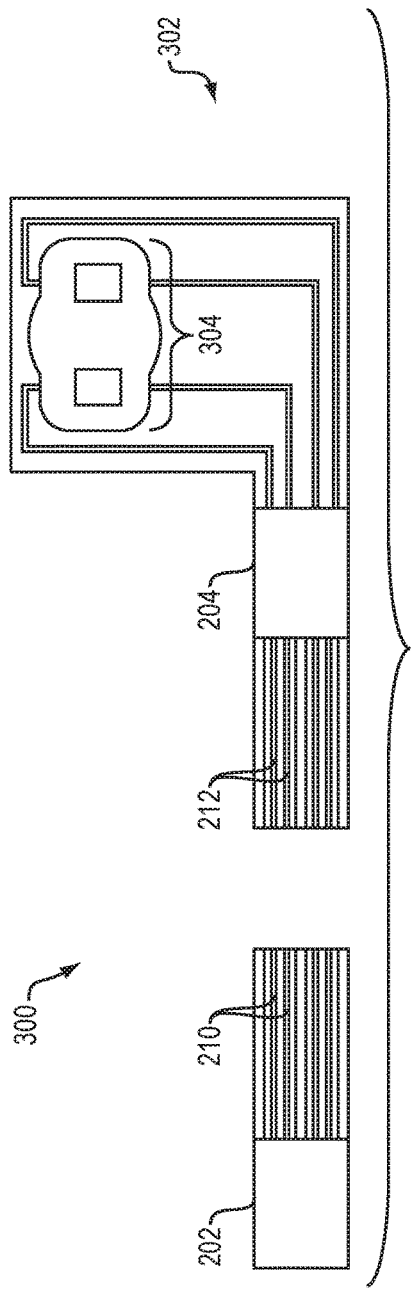
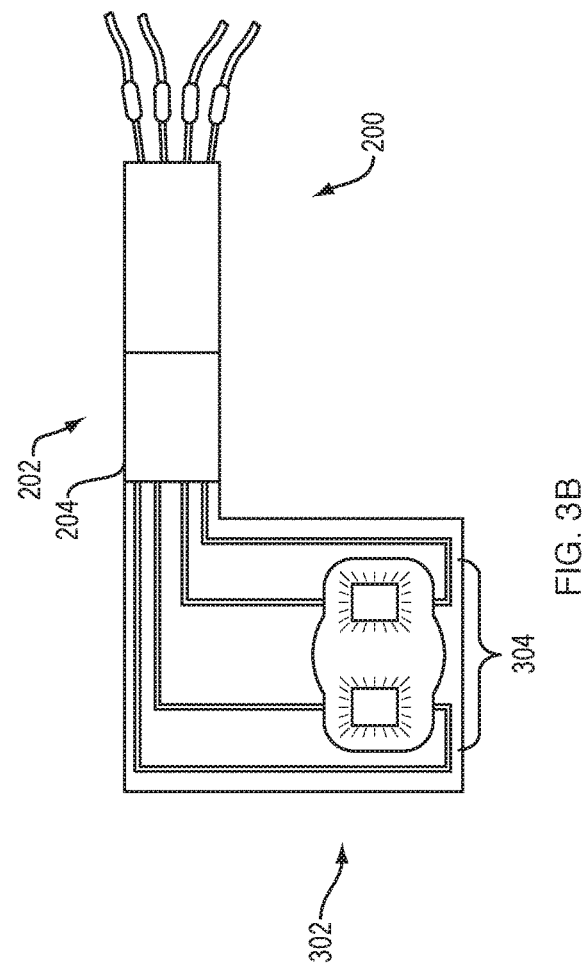

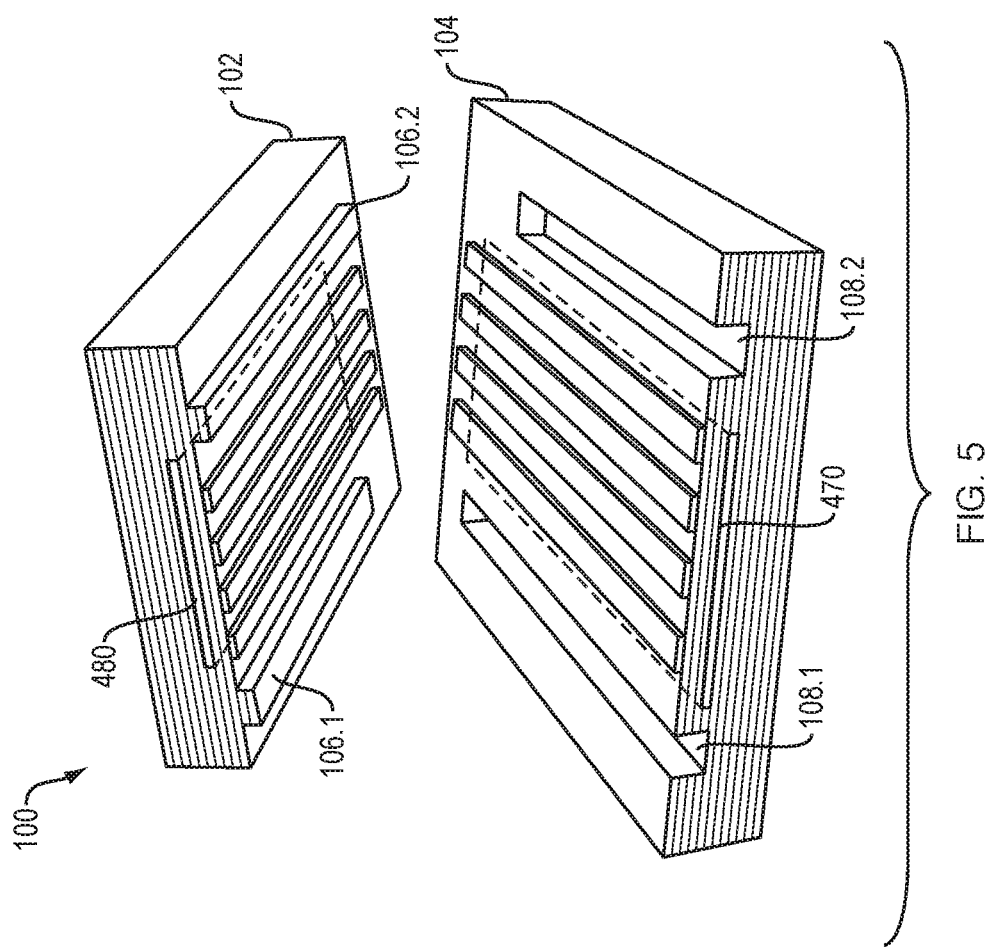

ELECTRICAL CONNECTORS, CIRCUIT BOARDS, AND FABRICATION TECHNIQUES

BACKGROUND

In recent years, there has been increased interest in using additive approaches to fabricate circuits that are printed to create electronics with different form factors that are flexible, conformable, and/or wearable. Conventional technology includes printed electrical/electronic circuits and use of conventional connectors that must be soldered to the circuits to provide connectivity with remote circuitry. However, such conventional connectors can be bulky, rigid and inconsistent with the desired form factor for the circuit.

BRIEF DESCRIPTION OF EMBODIMENTS

In accordance with the present application, systems, methods, and apparatus are disclosed that allow the printing of a physical electrical connector along with a printed electrical/electronic circuit on a substrate. Embodiments herein include the integration of such a printed electrical connector with a printed electrical/electronic circuit and/or circuit board.

In one embodiment, a printed electrical connector design based on additive manufacturing technology includes two flat patterned thermoplastic plates (connector substrates) that are printed with mechanical registration features (registration elements) that align conductive traces (layer of conductive material) on the two plates of the electrical connector. The thermoplastic plates include a top plate and a bottom plate that are printed using an additive thermoplastic printing process. The top plate is printed with a plurality of raised alignment pedestals (protrusion, bump, etc.) and a plurality of metallic traces. The plurality of metallic traces are printed on the top plate at controlled distances from the plurality of raised alignment pedestals.

The bottom plate has a plurality of recessed channels or grooves and a corresponding plurality of metallic traces. The plurality of recessed channels of the bottom plate are configured to mate with the plurality of raised pedestals on the top plate.

The mechanical features (i.e., the pedestals and the channels) of the top and bottom plates serve to align the metallic traces that comprise the electrical connector. The top and bottom plates can be held together with a clip (compression element) or any other suitable mechanism. The planar geometry of the printed electrical connector design (as opposed to typical cylindrical geometries of electrical connectors made using conventional fabrication techniques) is consistent with additive 3D and 2D printing approaches.

Embodiments of the printed electrical connectors as discussed herein allow printed electrical/electronic circuits and/or devices to be manufactured and interfaced with other printed electrical/electronic circuits and/or devices. In this way, the disclosed printed electrical connector can be advantageously employed as an integral part of a printed circuit board (PCB) for any suitable kind of circuit, including, but not limited to, digital, analog, and/or microwave circuits.

Further embodiments herein include an apparatus comprising: a first connector substrate; a first electrically conductive layer of material disposed on a facing of the first connector substrate, the facing of the first connector substrate including at least a first registration element; a second connector substrate; a second electrically conductive layer of material disposed on a facing of the second connector substrate, the facing of the second connector substrate including at least a second registration element; and the first registration element and the second registration element operable to facilitate contact of the first electrically conductive layer of material to the second electrically conductive layer of material. In one embodiment, the first registration element and the second registration element appropriately align the second connector substrate to the first connector substrate such that the first electrically conductive layer of material on the first connector substrate mates with the second electrically conductive layer of material on the second connector substrate.

In one embodiment, the first registration element is fabricated from multiple successive layers of material disposed on the facing of the first connector substrate; the second registration element is an alignment channel (such as a void) in the second connector substrate.

The first connector substrate and the second connector substrate can be fabricated in any suitable manner. In one embodiment, one or both of the first connector substrate and the second connector substrate are fabricated from multiple successive layers of material.

Further embodiments herein a compression element operable to press the facing of the first connector substrate towards the facing of the second connector substrate to contact the first electrically conductive layer of material to the second electrically conductive layer of material. The compression element can be fabricated to be independently movable with respect to the first connector substrate and the second connector substrate.

The first electrically conductive layer of material disposed on the facing of the first substrate can be or include one or more traces. In one embodiment, the first electrically conductive layer of material disposed on the facing of the first substrate is or includes a transmission line suitable for high frequency operation such as a microstrip line or co-planar waveguide.

Similarly, the second electrically conductive layer of material disposed on the facing of the second substrate can be or include one or more traces. In one embodiment, the second electrically conductive layer of material disposed on the facing of the second substrate is or includes a transmission line suitable for high frequency operation such as a microstrip line or co-planar waveguide.

The facing of the first connector substrate can be fabricated to include a planar surface on which the first electrically conductive layer of material resides; the facing of the second connector substrate can be fabricated to include a planar surface on which the second electrically conductive layer of material resides. In such an embodiment, the electrically conductive layer of material on the facing of the first connector substrate is connectable to the electrically conductive layer of material on the facing of the second connector substrate via orthogonal or other angular movement of the planar surface of the first connector substrate in a first direction towards the planar surface of the second connector substrate.

Yet further embodiments herein include a compression element slideable in a second direction different than the first direction, the compression element operable to press the facing of the first connector substrate towards the facing of the second connector substrate to contact the first electrically conductive layer of material to the second electrically conductive layer of material.

In one embodiment, the first connector substrate and/or the second connector substrate are printed using additive manufacturing technology. As a further example, the fabricator can be configured to print the first connector substrate, second connector substrate, compression element, etc., using additive manufacturing technology.

In accordance with further embodiments, the first connector substrate is part of a circuit board on which circuitry resides; the first connector substrate can be disposed at any suitable location on the circuit board such as on an edge of the circuit board.

Another embodiment herein includes an apparatus comprising: a first connector substrate; a first electrically conductive layer of material disposed on a facing of the first connector substrate, the facing of the first connector substrate including first registration elements, the first registration elements and second registration element on a second connector substrate are operable to facilitate alignment and contact of the first electrically conductive layer of material on the first connector substrate to a second electrically conductive layer of material on the second connector substrate.

In one embodiment, the first registration element is fabricated from multiple successive layers of material disposed on the facing of the first connector substrate; the second registration element is an alignment channel (such as a void) in the second connector substrate.

In accordance with further embodiments, a fabricator fabricates the first connector substrate as part of a circuit board; the first connector substrate can be disposed on an edge of the circuit board.

In accordance with further embodiments, the first connector substrate is an integral part of a circuit board fabricated from the multiple successive layers. In such an embodiment, the first connector substrate is disposed on an edge of the circuit board.

Further embodiments herein include a method comprising: via a fabricator (such as a manufacturing facility, printer, etc.): fabricating a first registration element and a first electrically conductive layer of material on a facing of a first connector substrate; and fabricating a second registration element and a second electrically conductive layer of material on a facing of a second connector substrate, the first registration element and the second registration element operable to facilitate alignment and contact of the first electrically conductive layer of material to the second electrically conductive layer of material.

In accordance with further embodiments, the fabricator fabricates the first connector substrate and the second connector substrate from multiple successive layers of material (same or different material). In one embodiment, the fabricator (such as a manufacturing facility, printer, etc.) fabricates the first registration element from multiple successive layers of material disposed on the facing of the first connector substrate; the fabricator fabricates the second registration element as an alignment channel in the second connector substrate.

Further embodiments herein include fabricating a compression element. The compression element is operable to press the facing of the first connector substrate towards the facing of the second connector substrate to contact the first electrically conductive layer of material to the second electrically conductive layer of material. In one embodiment, the compression element is independently movable with respect to both the first connector substrate and the second connector substrate.

As previously discussed, the first electrically conductive layer of material can be fabricated as a first microstrip or co-planar waveguide transmission line on the facing of the first connector substrate; the second electrically conductive layer of material can be fabricated as a second microstrip or co-planar waveguide transmission line on the facing of the second connector substrate.

Further embodiments herein include producing the facing of the first connector substrate to include a planar surface on which the first electrically conductive layer of material resides; producing the facing of the second connector substrate to include a planar surface on which the second electrically conductive layer of material resides; and wherein the electrically conductive layer of material on the facing of the first connector substrate is connectable to the electrically conductive layer of material on the facing of the second connector substrate via orthogonal movement of the planar surface of the first connector substrate towards the planar surface of the second connector substrate.

Other features, functions, and aspects of the present application will be evident from the Detailed Description that follows.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings:

FIG. 2b is a further perspective view of the fabricated version of the alternative embodiment of the printed electrical connector of FIG. 1 according to embodiments herein.

FIG. 2c is a detailed plan view of a top plate of the fabricated version of the alternative embodiment of the printed electrical connector of FIG. 1, showing a plurality of raised pedestal structures and a plurality of metallic traces according to embodiments herein.

FIG. 3a is a plan view of the fabricated version of the alternative embodiment of the printed electrical connector of FIG. 1 whereby one half of the connector is printed/integrated with a simple printed circuit board with two Light Emitting Diode (LED) chips (shown on right side) according to embodiments herein.

FIG. 3b is a further plan view of an assembled version of the alternative embodiment of the printed electrical connector/PCB pair shown in FIG. 3A demonstrating current flow through the connector required to energize the LEDs according to embodiments herein.

FIG. 5 is an example diagram illustrating fabrication of a ground plane in one or more connector substrates for use in a high frequency connector relaying on a microstrip transmission line according to embodiments herein.

DETAILED DESCRIPTION OF EMBODIMENTS

Embodiments herein include systems, methods, and apparatuses, etc., that allow the printing of a physical electrical connector along with a printed electrical/electronic circuit, as well as the integration of such a printed electrical connector with a printed electrical/electronic circuit.

Figure 1:
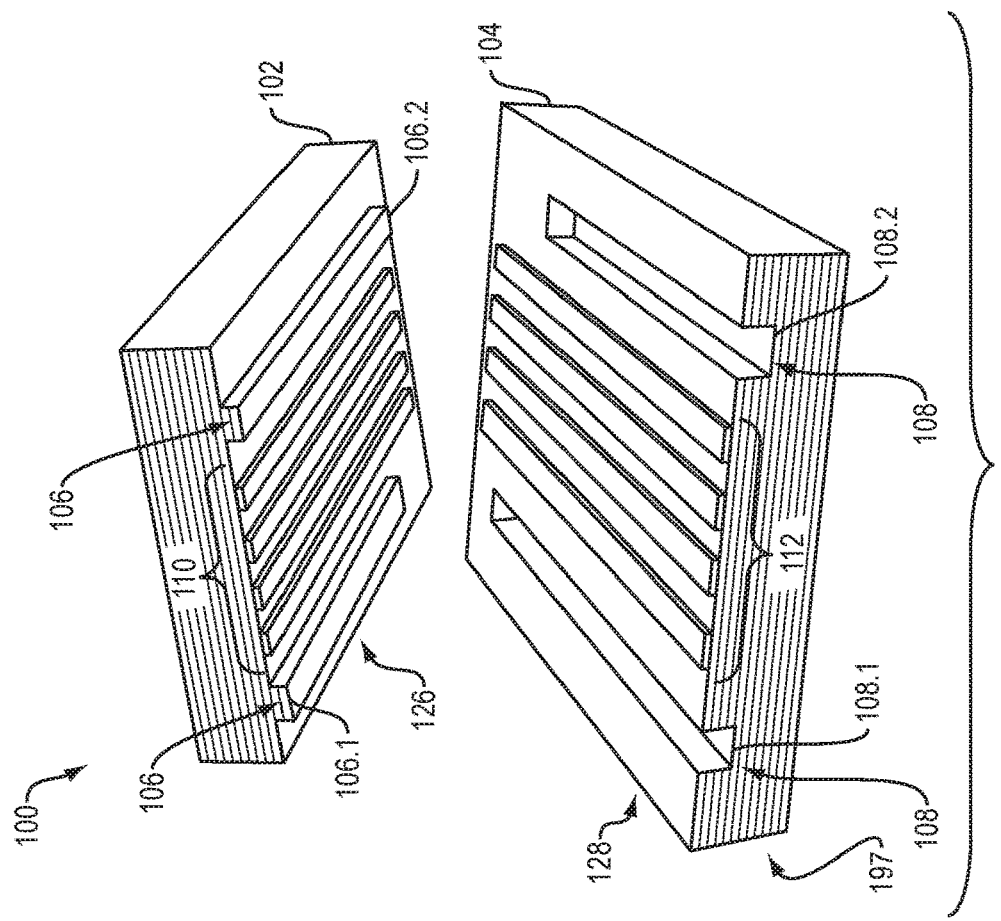
FIG. 1 is an exploded perspective view of an exemplary printed electrical connector according to embodiments herein.

More specifically, FIG. 1 depicts an illustrative embodiment of an example printed electrical connector design 100 based on additive manufacturing technology according to embodiments herein.

As shown in FIG. 1, the printed electrical connector design 100 includes two flat (planar) patterned thermoplastic plates, namely, a top plate 102 (connector substrate) and a bottom plate 104 (connector substrate). Each plate can be made from any suitable non-conductive material.

Each of the plates 102 and 104 are printed with mechanical registration elements (e.g., alignment pedestals 106 or recessed channels 108) that align conductive metallic traces 110 on the top plate 102 to the metallic traces 112 on the bottom plates 104, respectively.

FIG. 1 depicts four metallic traces 110 on the top plate 102 (first substrate), and four corresponding metallic traces 112 on the bottom plate (second substrate). It is noted that the top and bottom plates 102, 104 can include any suitable number of metallic traces, channels, pedestals, etc.

In one embodiment, the top plate 102 and the bottom plate 104 are printed using an additive thermoplastic printing process such as additive manufacturing. Additive Manufacturing (AM) is an appropriate name to describe the technologies that build 3D objects by adding layer-upon-layer of material 197 such as plastic, metal, etc.

In one embodiment, the top plate 102 is manufactured via application of multiple layers of (thermo) plastic material. The traces 110 are bonded to a planar portion of facing 126 on the surface of top plate 102 as shown in FIG. 1. The bottom plate 104 is manufactured via application of multiple layers of (thermo) plastic material. The traces 112 are bonded to a planar portion of facing 128 on the surface of bottom plate 104 as shown in FIG. 1.

As further shown, the top plate 102 is printed to include two raised pedestals 106.1, 106.2 (such as protrusions, bumps, etc.) and the plurality of metallic traces 110, which are printed on the top plate 102 at controlled distances from the two alignment pedestals 106.1, 106.2.

Note that the traces can be disposed in any suitable location on the facing 126 of the plate 102 and the facing 128 of the plate 104. For example, if desired, the first trace can be formed on a surface of the pedestal 106.1; a second trace can be formed on the surface of pedestal 106.2. A third trace can be formed on a surface of the pedestal 106.1; a second trace can be formed on the surface of pedestal 106.2.

The bottom plate 104 has two recessed channels 108.1, 108.2 (such as grooves, cavities, etc.) and the plurality of metallic traces 112. The two recessed channels 108.1, 108.2 of the bottom plate 104 are configured to mate with the two raised pedestals 106.1, 106.2 on the top plate 102, respectively. The mechanical features such as registration elements (i.e., the pedestals and channels) of the top and bottom plates 102, 104 serve to align the metallic traces 110, 112 that comprise the printed electrical connector 100 when the facing 126 of the top plate 102 is moved to contact facing 128 of the bottom plate 104.

The top and bottom plates 102, 104 can be held together with a clip, adhesive, snap fit, or any other suitable mechanism.

The planar geometry of the printed electrical connector design 100 (as opposed to typical cylindrical geometries of electrical connectors made using conventional fabrication techniques), as illustrated in FIG. 1, is consistent with additive 3D and 2D printing approaches. The printed electrical connector design 100 allows printed electrical/electronic circuits and/or devices to be manufactured and interfaced with other printed electrical/electronic circuits and/or devices. In this way, the printed electrical connector 100 can be advantageously employed as an integral part of a printed circuit board (PCB) for any suitable kind of circuit, including, but not limited to, digital, analog, and/or microwave circuits.

Figure 2A:
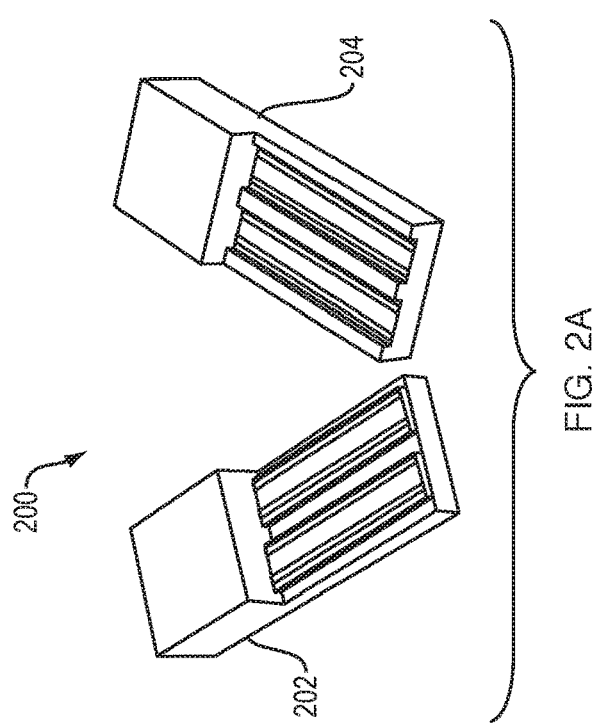
FIG. 2a is a perspective view of an exemplary fabricated version of an alternative embodiment of the printed electrical connector of FIG. 1 according to embodiments herein.

FIG. 2a depicts an exemplary fabricated version 200 (e.g., a 3D-printed DC electrical connector) of an alternative embodiment of the printed electrical connector of FIG. 1. As shown in FIG. 2a, the fabricated printed electrical connector 200 includes a top plate 202 and a bottom plate 204, which can be printed on a hybrid 3D printer system using a PLA thermoplastic (such as the black material shown in FIG. 2) insulator material (or any other suitable insulator material) and conductive ink/epoxy (electrically conductive material).

The thermoplastic insulator material can provide the structural basis of the printed electrical connector 200, and further provide the dielectric properties needed for the electrical design of the printed electrical connector 200. It is noted that if the thermoplastic insulator material does not have the requisite dielectric properties needed for the electrical design, then it is possible that there could be a different dielectric that would be an ink-like material that would be dispensed or patterned using a process similar to the formation of the conductive ink.

The conductive ink can be silver (Ag) based conductive ink (or any other suitable conductive ink) for use in forming the metallic traces (e.g., four metallic traces) on the top and bottom plates 202, 204. The top and bottom plates 202, 204 can easily snap and/or interlock together, while the mechanical features (i.e., the pedestals and channels) serve to align the four conductive metallic traces on the top and bottom plates 202, 204 of the printed electrical connector 200.

FIG. 2b depicts another view of the fabricated printed electrical connector 200 of FIG. 2a. As shown in FIG. 2b, the top plate 202 includes a plurality of metallic traces 210, and the bottom plate 204 likewise includes a plurality of metallic traces 212. The fabricated printed electrical connector 200 can have example dimensions of 20 mm×8 mm×40 mm, or any other suitable dimensions. FIG. 2c depicts a detailed plan view of the top plate 202 of the fabricated printed electrical connector 200, showing a plurality of raised pedestal structures 206.1, 206.2, 206.3 and a plurality of metallic traces 210.1, 210.2, 210.3, 210.4.

FIG. 3a is an example diagram view of a fabricated version of the alternative embodiment of the printed electrical connector of FIG. 1 in which one half of the connector is printed/integrated with a printed circuit board including two Light Emitting Diode (LED) chips (shown on right side) according to embodiments herein.

As more particularly shown in FIG. 3a, the connector system 300 includes the top plate 202 (top connector), the bottom plate 204 (bottom connector), and an example printed circuit board 302 including a plurality of commercial off the shelf (COTS) light emitting diodes (LEDs) 304. The plurality of metallic traces 210 electrically couple to the plurality of metallic traces 212 of the bottom plate 204 when the bottom plate 204 is connected to the top plate 202 as shown in FIG. 3b. In such an instance, after the bottom plate 204 is connected to the top plate 202, traces 210 of the top plate 202 convey LED control signals to the traces 212 of the bottom plate 204; traces 212 of the bottom plate 204 convey the control signals to the light emitting diodes 304 to control illumination of same.

As more particularly shown in FIG. 3b, the top plate 202 and the bottom plate 204 are snapped/interlocked together. As previously discussed the state of the LEDs 304 are controlled by signals conveyed through the connectivity 200 provided by the top plate 202 and the bottom plate 204 (in the connected state).

As previously discussed, the printed electrical connector 204 can be manufactured and interfaced with the example printed circuit 302 such as LEDs 304. It will be appreciated, however, that the printed electrical connectors and corresponding components can be manufactured, interfaced with, and employed as an integral part of a PCB for any suitable kind of circuit, including, but not limited to, digital, analog, and/or microwave circuits.

Figure 4A:
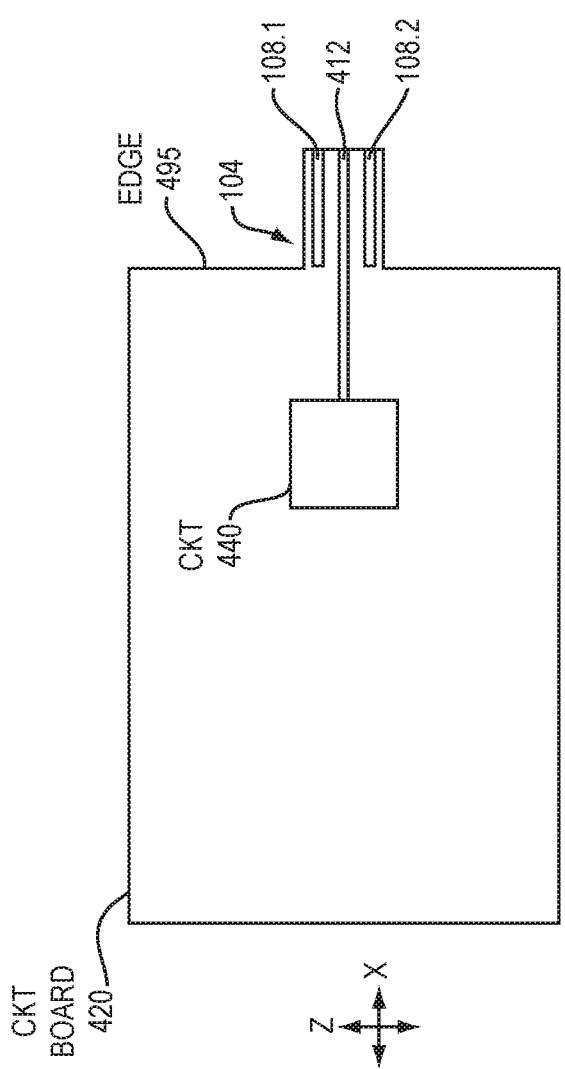
FIG. 4A is an example top view of a circuit board including a first connector substrate according to embodiments herein.
Figure 4B:
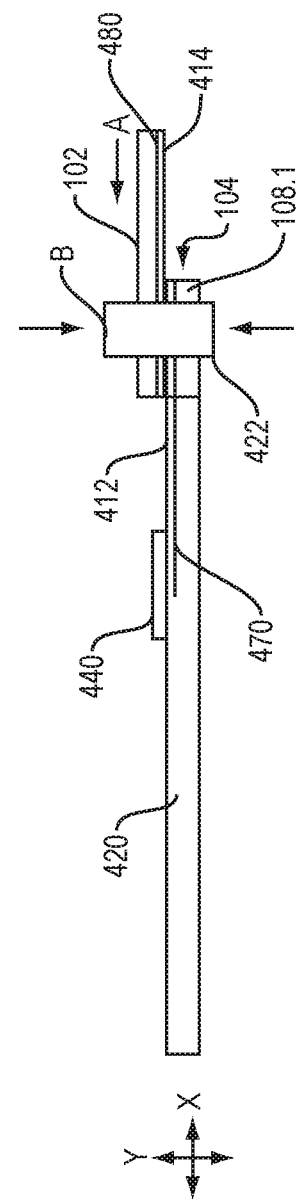
FIG. 4B is an example side view diagram of a circuit board diagram illustrating a connection between the first connector substrate and a second connector substrate using a compression element according to embodiments herein.

FIG. 4A is an example top view diagram illustrating a circuit board according to embodiments herein. FIG. 4B is an example side view diagram illustrating a circuit board associated with connector substrates and compression element according to embodiments herein.

As shown, the circuit board 420 includes circuitry 440 that drives first electrically conductive layer of material 412 such as a microstrip line, which resides above a ground plane 470. In one embodiment, the bottom plate 104 (first connector substrate) extends beyond the edge 495 of the circuit board 420. As previously discussed, the registration elements 108.1 and 108.2 facilitate registration of the second connector substrate 102 to the bottom plate 104 (formed on circuit board 420) to align and mate the top plate 102 (second connector substrate) to the bottom plate 104, resulting in contact of the first electrically conductive layer of material 412 on the bottom plate 104 to the second electrically conductive layer of material 414 on the second connector substrate 102.

The top plate 102 and bottom plate 104 can be fabricated in any suitable manner. In one embodiment, one or both of the first connector substrate and the second connector substrate are fabricated from multiple successive layers of material.

In accordance with further embodiments, the registration elements 106 (106.1 and 106.2) are fabricated from multiple successive layers of material disposed on the facing 126 (as shown in FIG. 1) of the top plate 102; the registration elements 108 (108.1 and 108.2) are alignment channels (such as grooves, voids, etc.) in the connector substrate 104.

In this example embodiment, the compression element 422 (such as a ring, clamp, etc.) slides along the x-axis from location A to location B. Compression element 422 is operable to press the facing 128 of the bottom plate 104 in a direction along the Y-axis towards the facing 126 of the top plate 102 to contact the first electrically conductive layer of material (traces 112) to the second electrically conductive layer of material (traces 110). In one embodiment, the compression element 422 is fabricated to be independently movable with respect to the top plate 102 and the bottom plate 104.

FIG. 5 is an example diagram illustrating a connector assembly according to embodiments herein.

In this example embodiment, the bottom plate 104 includes a ground plane 470 disposed beneath one or more microstrip lines. The top plate 102 includes a ground plane 480 disposed beneath one or more microstrip lines.

As previously discussed, each connector substrate can be formed via multiple different layers of material (such as insulating plastic layers, metallic layers, etc.).

Figure 6:
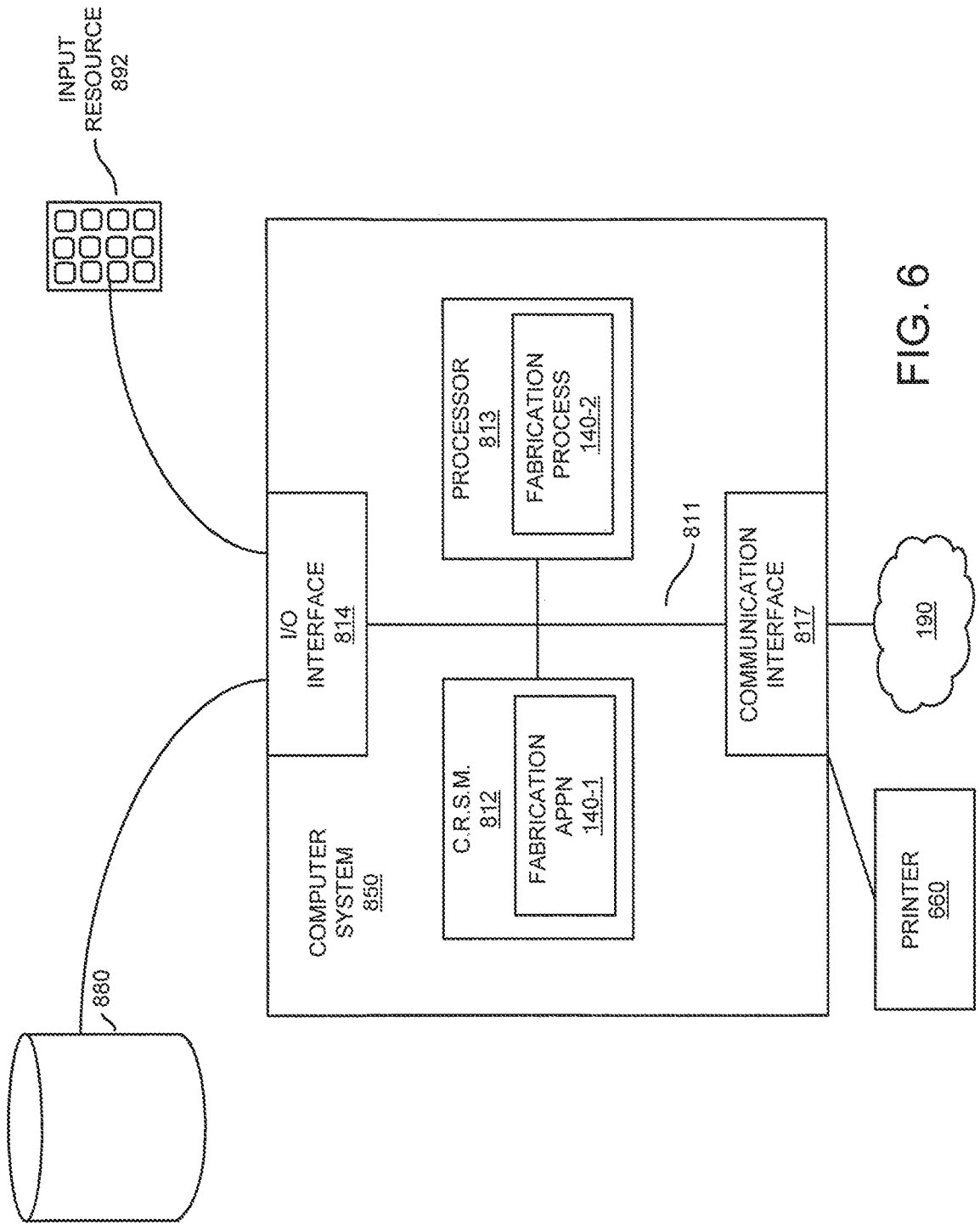
FIG. 6 is an example diagram illustrating a computer system architecture to facilitate fabrication of one or more circuit substrates including integrated connectors according to embodiments herein.

FIG. 6 is an example block diagram of a computer system and printer device for implementing any of the operations as previously discussed to fabricate connector components according to embodiments herein.

As shown, computer system 850 of the present example includes an interconnect 811 that couples computer readable storage media 812 such as a non-transitory type of media (i.e., any type of hardware storage medium) in which digital information can be stored and retrieved, a processor 813, I/O interface 814, and a communications interface 817.

I/O interface(s) 814 supports connectivity to repository 880 and input resource 892.

Computer readable storage medium 812 can be any hardware storage device such as memory, optical storage, hard drive, floppy disk, etc. In one embodiment, the computer readable storage medium 812 stores instructions and/or data.

As shown, computer readable storage media 812 can be encoded with fabrication application 140-1 (e.g., including instructions) to carry out any of the operations as discussed herein. The fabrication application controls application of different layers of material to form circuit board 420 and corresponding top plate 102 and bottom plate 104 according to specified dimensions.

During operation of one embodiment, processor 813 accesses computer readable storage media 812 via the use of interconnect 811 in order to launch, run, execute, interpret or otherwise perform the instructions in fabrication application 140-1 stored on computer readable storage medium 812. Execution of the fabrication application 140-1 produces fabrication process 140-2 to carry out any of the operations and/or processes as discussed herein.

Those skilled in the art will understand that the computer system 850 can include other processes and/or software and hardware components, such as an operating system that controls allocation and use of hardware resources to fabrication application 140-1.

In accordance with different embodiments, note that computer system may reside in any of various types of devices, including, but not limited to, a mobile computer, a personal computer system, a printer implementing additive technology to produce circuit boards, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 850 may reside at any location or can be included in any suitable resource in any network environment to implement functionality as discussed herein.

Functionality supported by the different resources will now be discussed via flowchart in FIG. 7. Note that the steps in the flowcharts below can be executed in any suitable order.

Figure 7:
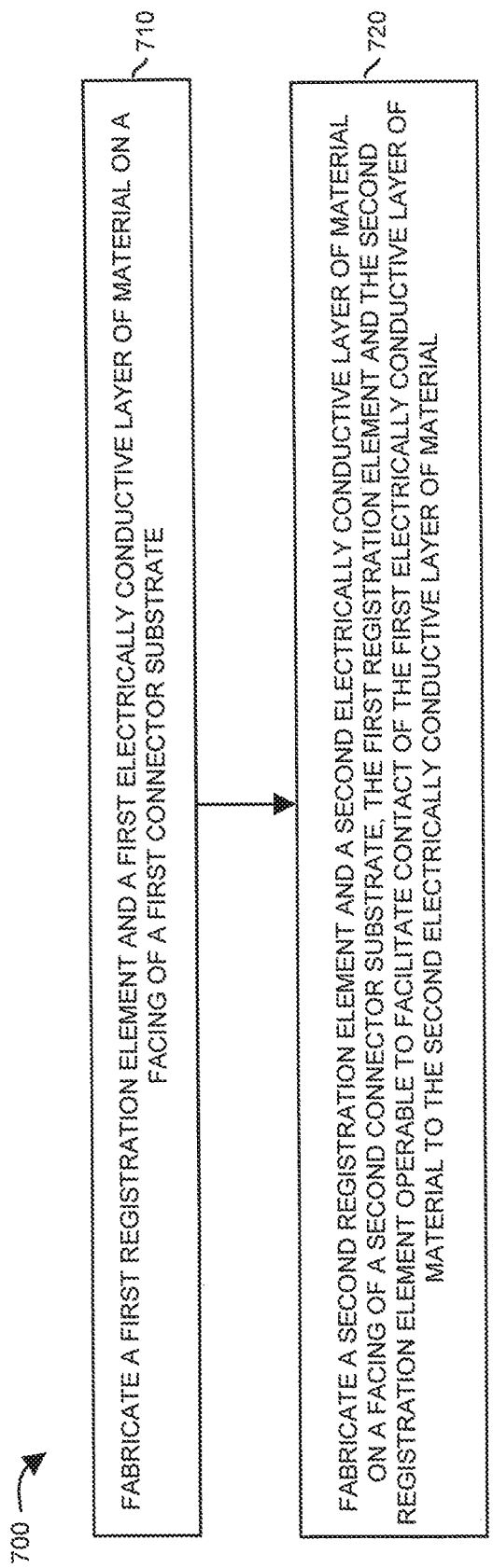
FIG. 7 is an example diagram illustrating a method according to embodiments herein.

FIG. 7 is a flowchart 700 illustrating an example method according to embodiments herein. Note that there will be some overlap with respect to concepts as discussed above.

In processing operation 710, a fabricator (such as computer system 850, printer 660, manufacturing facility, etc.) fabricates first registration elements 108 and a first electrically conductive layer of material (such as one or more traces 112, conductive strips, etc.) on a facing 128 of plate 104 (a first connector substrate).

In processing operation 720, the fabricator fabricates second registration elements 106 and a second electrically conductive layer of material (such as traces 110) on a facing 126 of plate 102 (such as a second connector substrate). The first registration elements and the second registration elements are operable to facilitate contact of the first electrically conductive layer of material (traces 112) to the second electrically conductive layer of material (traces 110).

Note again that techniques herein are well suited to facilitate fabrication of connectors on circuit boards. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
    a first connector substrate;
    a first electrically conductive layer of material disposed on a facing of the first connector substrate, the facing of the first connector substrate including a first electrically non-conductive registration element;
    a second connector substrate;
    a second electrically conductive layer of material disposed on a facing of the second connector substrate, the facing of the second connector substrate including a second electrically non-conductive registration element; and
    engagement of the first electrically non-conductive registration element into the second electrically non-conductive registration element operable to contact the first electrically conductive layer of material to the second electrically conductive layer of material; and
    a compression element operable to press the facing of the first connector substrate towards the facing of the second connector substrate to contact the first electrically conductive layer of material to the second electrically conductive layer of material.

2. The apparatus as in claim 1, wherein the first electrically non-conductive registration element is fabricated from multiple successive layers of material disposed on the facing of the first connector substrate;
    wherein the second electrically non-conductive registration element is fabricated from multiple successive layers of material disposed on the facing of the second connector substrate;
    wherein the first electrically non-conductive registration element is a recessed channel in the first connector substrate; and
    wherein the second electrically non-conductive registration element is a protrusion from a planar surface of the facing of the second connector substrate.

3. The apparatus as in claim 1, wherein the first connector substrate and the second connector substrate are fabricated from multiple successive layers of electrically non-conductive material.

4. The apparatus as in claim 1, wherein the compression element is independently movable with respect to the first connector substrate and the second connector substrate.

5. The apparatus as in claim 1, wherein the first electrically conductive layer of material disposed on the facing of the first substrate is a transmission line; and
    wherein the second electrically conductive layer of material disposed on the facing of the second substrate is a transmission line.

6. The apparatus as in claim 1, wherein the facing of the first connector substrate includes a planar surface on which the first electrically conductive layer of material resides;
    wherein the facing of the second connector substrate includes a planar surface on which the second electrically conductive layer of material resides; and
    wherein the electrically conductive layer of material on the facing of the first connector substrate is connectable to the electrically conductive layer of material on the facing of the second connector substrate via movement of the planar surface of the first connector substrate in contact with the planar surface of the second connector substrate.

7. The apparatus as in claim 1, wherein
the compression element is slideable in a second direction different than a first direction of contacting the facing of the first connector substrate to the facing of the second connector substrate, the compression element operable to press the facing of the first connector substrate towards the facing of the second connector substrate to contact the first electrically conductive layer of material to the second electrically conductive layer of material.

8. The apparatus as in claim 1, wherein the first connector substrate is printed using additive manufacturing technology.

9. The apparatus as in claim 1, wherein the first connector substrate is part of a circuit board on which circuitry resides; and
wherein the first connector substrate is disposed on an edge of the circuit board.

10. The apparatus as in claim 1 further comprising:
a third electrically non-conductive registration element, the third electrically non-conductive registration element disposed on the facing of the first connector substrate;
a fourth electrically non-conductive registration element, the fourth electrically non-conductive registration element disposed on the facing of the second connector substrate; and
wherein engagement of the third electrically non-conductive registration element into the fourth electrically non-conductive registration element is operable to contact the first electrically conductive layer of material to the second electrically conductive layer of material.

11. The apparatus as in claim 10, wherein the first connector substrate includes a first ground plane, the first ground plane spaced apart from the first electrically conductive layer of material via a portion of the first connector substrate; and
wherein the second connector substrate includes a second ground plane, the second ground plane spaced apart from the second electrically conductive layer of material via a portion of the second connector substrate.

12. The apparatus as in claim 11, wherein the engagement of the first electrically non-conductive registration element into the second electrically non-conductive registration element and the engagement of the third electrically non-conductive registration element into the fourth electrically non-conductive registration element sandwiches the first electrically conductive layer of material and the second electrically conductive layer of material between the first ground plane and the second ground plane.

13. A method comprising:
fabricating a first registration element and a first electrically conductive layer of material on a facing of a first connector substrate, the first registration element fabricated from multiple successive layers of material disposed on the facing of the first connector substrate; and
fabricating a second registration element and a second electrically conductive layer of material on a facing of a second connector substrate, the second registration element fabricated from multiple successive layers of material on the facing of the second connector substrate; and
wherein the first registration element and the second registration element are operable to align and contact the first electrically conductive layer of material to the second electrically conductive layer of material, the method further comprising:
fabricating a compression element, the compression element operable to press the facing of the first connector substrate towards the facing of the second connector substrate to contact the first electrically conductive layer of material to the second electrically conductive layer of material.

14. The method as in claim 13, wherein the compression element is independently movable with respect to the first connector substrate and the second connector substrate.

15. The method as in claim 13 further comprising:
fabricating the first electrically conductive layer of material as a first microstrip line on the facing of the first connector substrate; and
fabricating the second electrically conductive layer of material as a second microstrip line on the facing of the second connector substrate.

16. The method as in claim 13 further comprising:
producing the facing of the first connector substrate to include a planar surface on which the first electrically conductive layer of material resides;
producing the facing of the second connector substrate to include a planar surface on which the second electrically conductive layer of material resides; and
wherein the electrically conductive layer of material on the facing of the first connector substrate is connectable to the electrically conductive layer of material on the facing of the second connector substrate via movement of the planar surface of the first connector substrate in contact with the planar surface of the second connector substrate.

17. The method as in claim 13 further comprising:
fabricating the first connector substrate as part of a circuit board, the first connector substrate disposed on an edge of the circuit board.

18. An apparatus comprising:
a first connector substrate;
a compression element;
a first electrically conductive layer of material disposed on a facing of the first connector substrate, the facing of the first connector substrate including a first registration element, the first registration element and a second registration element on a second connector substrate operable to align and contact the first electrically conductive layer of material to a second electrically conductive layer of material on the second connector substrate, the compression element operable to press the facing of the first connector substrate towards the facing of the second connector substrate to contact the first electrically conductive layer of material to the second electrically conductive layer of material;
wherein the first registration element is fabricated from multiple successive layers of material disposed on the facing of the first connector substrate.

19. The apparatus as in claim 18, wherein the second registration element is an alignment channel in the second connector substrate.

20. The apparatus as in claim 19, wherein the first connector substrate is an integral part of a circuit board fabricated from the multiple successive layers.

21. The apparatus as in claim 20, wherein the first connector substrate is disposed on an edge of the circuit board.

22. An apparatus comprising:
a first connector substrate;
a first electrically conductive layer of material disposed on a facing of the first connector substrate, the facing of the first connector substrate including a first electrically non-conductive registration element;
a second connector substrate;
a second electrically conductive layer of material disposed on a facing of the second connector substrate, the facing of the second connector substrate including a second electrically non-conductive registration element;
engagement of the first electrically non-conductive registration element into the second electrically non-conductive registration element operable to contact the first electrically conductive layer of material to the second electrically conductive layer of material;
wherein the first electrically conductive layer of material disposed on the facing of the first substrate is a transmission line;
wherein the second electrically conductive layer of material disposed on the facing of the second substrate is a transmission line;
wherein the first connector substrate includes a first ground plane, the first ground plane spaced apart from the first electrically conductive layer of material via a portion of the first connector substrate; and
wherein the second connector substrate includes a second ground plane, the second ground plane spaced apart from the second electrically conductive layer of material via a portion of the second connector substrate.

23. The apparatus as in claim 22, wherein the engagement of the first electrically non-conductive registration element into the second electrically non-conductive registration element sandwiches the first electrically conductive layer of material and the second electrically conductive layer of material between the first ground plane and the second ground plane.

24. An apparatus comprising:
a first connector substrate;
a first electrically conductive layer of material disposed on a facing of the first connector substrate, the facing of the first connector substrate including a first electrically non-conductive registration element;
a second connector substrate;
a second electrically conductive layer of material disposed on a facing of the second connector substrate, the facing of the second connector substrate including a second electrically non-conductive registration element;
engagement of the first electrically non-conductive registration element into the second electrically non-conductive registration element operable to contact the first electrically conductive layer of material to the second electrically conductive layer of material;
wherein the first electrically conductive layer of material is a first strip of material;
wherein the first registration element is a channel disposed in the first substrate, the channel extending parallel to the first strip of material;
wherein the second electrically conductive layer of material is a second strip of material; and
wherein the second registration element is a protrusion from the facing of the second substrate, the protrusion extending parallel to the second strip of material, insertion of the protrusion in the channel aligning the first strip and the second strip to contact each other.

* * * * *